United States Patent [19]

Rodseth

[11] Patent Number: 4,587,377
[45] Date of Patent: May 6, 1986

[54] ELECTRICALLY INSULATING FASTENER FOR HEAT SINKS OF DIFFERENT THICKNESSES

[75] Inventor: William G. Rodseth, Elgin, Ill.

[73] Assignee: Illinois Tool Works Inc., Chicago, Ill.

[21] Appl. No.: 653,111

[22] Filed: Sep. 21, 1984

[51] Int. Cl.⁴ .............................................. H01B 17/24
[52] U.S. Cl. ........................... 174/16 HS; 174/138 G; 361/386; 361/388; 411/533; 411/546
[58] Field of Search .......... 174/16 HS, 138 D, 138 G; 361/386, 387, 388, 403, 412; 411/533, 546, 338, 339, 369; 165/80 A, 80 B; 357/81

[56] References Cited

U.S. PATENT DOCUMENTS

| | | | |
|---|---|---|---|
| 3,122,679 | 2/1964 | Kislan et al. | 165/80 B |
| 3,263,200 | 7/1966 | Kocmich | 174/138 G |
| 3,272,952 | 9/1966 | McKeon | 174/138 D X |
| 3,369,597 | 2/1968 | Dronsuth et al. | 174/16 HS X |
| 3,619,473 | 11/1971 | Meyerhoff et al. | 174/16 HS |
| 3,652,903 | 3/1972 | Eriksson et al. | 174/16 HS X |
| 3,801,874 | 4/1974 | Stefani | 174/DIG. 5 X |
| 4,007,477 | 2/1977 | Goodman | 357/81 |
| 4,041,523 | 8/1977 | Vogt | 357/81 X |
| 4,266,267 | 5/1981 | Ruegg | 174/16 HS X |
| 4,446,504 | 5/1984 | Jordan et al. | 361/386 |

FOREIGN PATENT DOCUMENTS 695585 3/1963 Canada.

Primary Examiner—Arthur T. Grimley
Assistant Examiner—M. Nimmo
Attorney, Agent, or Firm—David I. Roche; Thomas W. Buckman

[57] ABSTRACT

An electrically insulating fastener having three pre-assembled elements. A nut with a tubular body and an integral spring flange has a disc-shaped spacer attached to the flange. The spacer has a central opening with a cylindrical collar formed around it. A flexible and resilient rubber sleeve is fitted over the collar. The nut, spacer, and sleeve form a unitary fastener which can be used with a headed threaded fastener to make electrical connections through heat sinks of various thicknesses.

4 Claims, 5 Drawing Figures

U.S. Patent  May 6, 1986  4,587,377
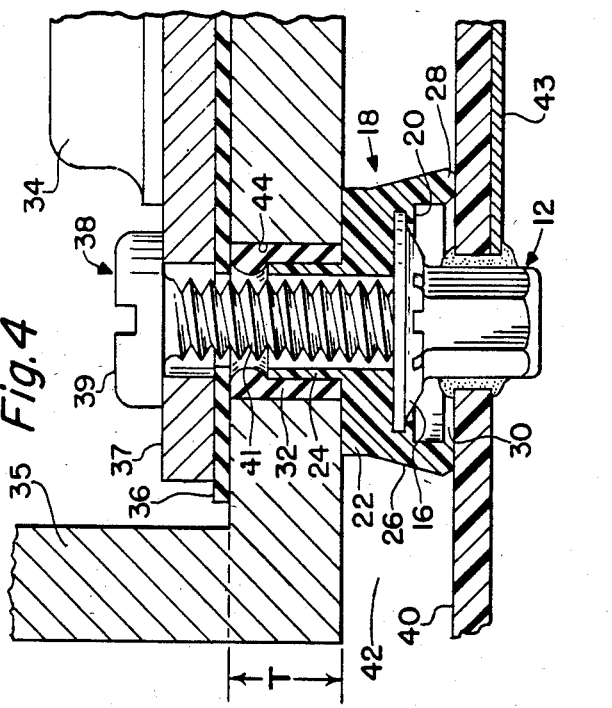
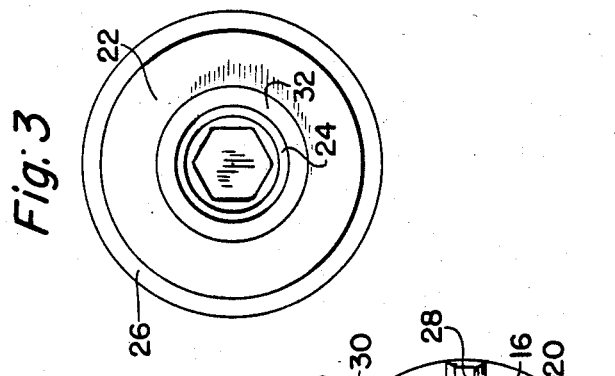
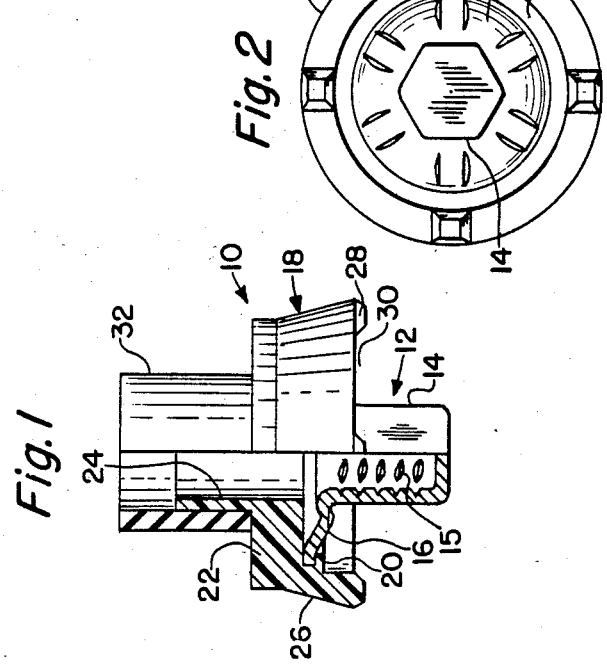
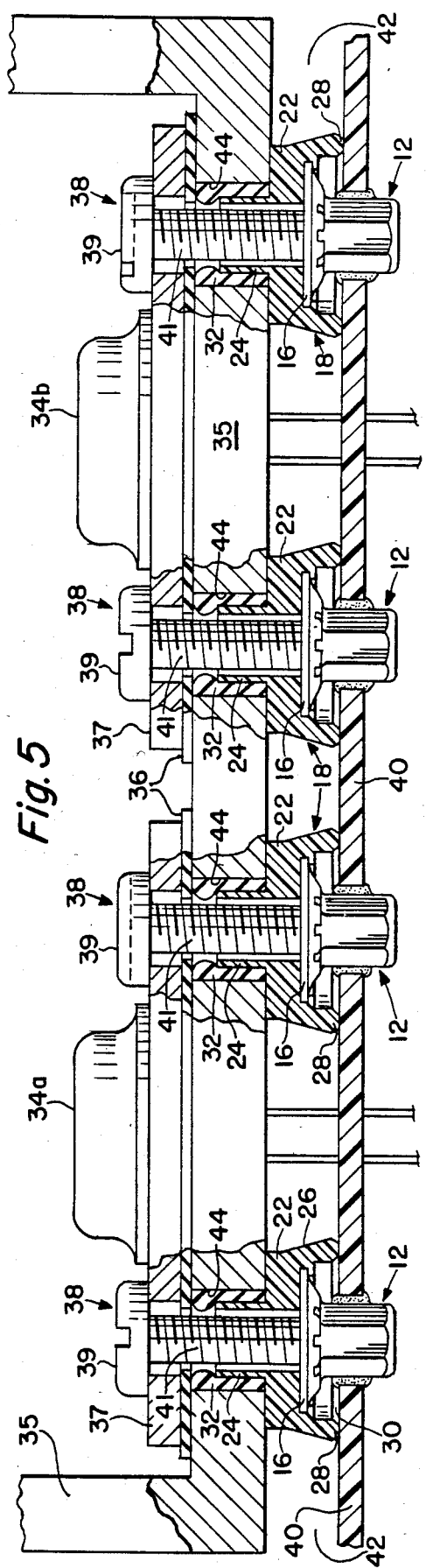

ELECTRICALLY INSULATING FASTENER FOR HEAT SINKS OF DIFFERENT THICKNESSES

BACKGROUND AND SUMMARY OF THE INVENTION

This invention relates to electrical insulators, and in particular to insulators used in attaching heat sink assemblies comprising heat generating electronic components and heat dissipators to printed circuit boards.

In some circuit designs it is desirable to attach a plurality of such components to a single heat sink. In many heat generating components, the base or support of the component also serves as a terminal for the component. In many transistors the collector terminal is connected to a circuit through mounting hardware. The mounting hardware, is in effect, a circuit element. If a plurality of components are attached to a single heat sink, the heat sink will tend to allow current to flow directly between the components. It is therefore sometimes necessary to mount components in such a way as to:

(1) promote electrical conductivity between fasteners and components, (2) maintaining thermal conductivity between components and the heat sink: and (3) preventing current flow between the components and the heat sink.

Additional problems associated with unwanted current flow between components and heat sinks can also be attributed to the fact that heat sinks may have different thicknesses. Having heat sinks of various thicknesses in a single product may be the result of design interior or may be the result of manufacturing tolerances. The use of heat sinks with different thicknesses can create gaps between fastening hardware and heat sink elements, if a single type of rigid insulating hardware is used. When high voltage is present, arching can create a short between components and the heat sink or among components.

Accordingly, it is an object of the present invention to provide an electrical insulator which is able to accommodate heat sinks of various sizes.

Another object is to provide a preassembled fastener and insulator combination which facilitates assembly of heat generating electrical components to a heat sink while preventing short circuits among the components.

Yet another object is to provide an insulator which is capable of withstanding continuous clamp load between heat sinks and mounting fasteners while maintaining electrical isolation between them.

Still another object of the invention is to provide a heat sink assembly having a plurality of components which may be quickly and easily connected to a printed circuit board.

These and other objects and advantages are achieved with an insulator which is preassembled to an electrically conductive fastener. The insulator is comprised of a plastic spacer and a rubber sleeve preassembled thereto. The fastener preferably has an integral spring washer to maintain clamp load and thermal conductivity between components and an associated heat sink. In a heat sink assembly having a plurality of components, the insulators are positioned generally at the interface between the conductive fastener and the heat sink. The insulator has a collar which extends into an aperture in a heat sink. The rubber sleeve fits over the collar and extends further into the aperture. The rubber sleeve can collapse axially to accommodate heat sinks of different thicknesses. The present invention will be better understood upon reading of the following specification read in conjunction with the attached drawings.

DETAILED DESCRIPTION OF THE DRAWINGS

FIG. 1 is an elevational view in partial section of the insulating fastener of the present invention.

FIG. 2 is a bottom end view of the fastener of FIG. 1.

FIG. 3 is a top end view of the fastener of FIG. 1.

FIG. 4 is an enlarged elevational view in partial section of a fastener of the present invention together with an associated heat sink, transistor, and circuit board.

FIG. 5 is an elevational view in partial section of a plurality of fasteners of the present invention together with a plurality of transistors and a single heat sink.

DETAILED DESCRIPTION OF THE INVENTION

FIGS. 1, 2 and 3 show an insulating fastener 10 comprised of three elements. The first element is a stamped metal tubular nut 12 which has an internally threaded tubular body 14 with threads 15 formed therein. An integral conical spring flange 16 extends radially outwardly from one end of the tubuar body 14. The nut 12 has a hexagonal exterior surface which is solderable.

The second element of the fastener 10 is a spacer 18 which is sonically welded into engagement with the flange 16. The sonically deformed portion 20 engages the outer periphery of the flange 16. The spacer 18 is generally comprised of a flat or generally planar disc 22 with an upstanding tubular cylindrical collar 24 extending in a direction opposite that of the tubular body 14. A generally axially extending generally conical skirt 26 extends from the outer periphery of the disc 22. The interior of the skirt has a conical shape to allow a cylindrical sonic welding tool to deform skirt material into engagement with the flange 16. A plurality of feet 28 are disposed on the free end of the skirt 26. The radially intermittently disposed feet 28 create flow channels 30 which allow free flow of air beneath the fastener.

The third element of the fastener is a cylindrical rubber sleeve 32 which is fitted over the collar 24, and which is adhesively bonded to the collar 24. The sleeve 32 is preferably made of a highly flexible and resilient silicone rubber material to make the sleeve easy to collapse or deflect in an axial direction. The interior sleeve 32 is bonded to the exterior of the collar 24. The axial extent of the sleeve is substantially greater than that of the collar 24.

The collar 24 acts as a guide for the shank 41 of the screw 38, and also acts as a means for aligning and attaching the sleeve 32 to the spacer 18. The concentricity of the spacer 18 and the sleeve 32, relative to the tubular body 14 results in the central location of the screw shank 41 in the aperture 44 in the heat sink. The central location of the screw in the aperture 44 is important in the prevention of current flow or arcing between the screw and the heat sink.

FIG. 4 shows the fastener of the present invention in the environment for which it was designed. A transistor 34 is attached to a heat sink 35 with an insulating pad 36 sandwiched therebetween. The heat sink 35 has a base thickness "T". The sleeve 32 is shown in an axially compressed condition. The screw 38 and the nut 12 maintain a clamp load between the base 37 of the transistor 34 and the heat sink 35 to insure thermal conductivity therebetween. Because the base 37 is an actual circuit element it is necessary to maintain electrical conductivity between the transistor base, the head 39 of the screw 38, the nut, and the circuit board 40, and, in particular, conductive material 43 on the board 40.

FIG. 5 shows a pair of transistors 34a and 34b. Again, because the transistor bases comprise actual circuit elements, it is necessary to electrically insulate the portion of the circuit which is formed by the screw 38. The four connections shown in FIG. 5 are substantially identical. In all cases the initial, uncompressed axial length of the sleeve 32 is greater than the thickness "T" of the heat sink base. The resilient and flexible nature of the sleeve 32 allows it to axially deform for complete isolation of the screw 38 from the heat sink 35. The spacer 18 abuts the underside of the heat sink and isolates the nut 12 from the heat sink 35. The skirt 26 together with the thickness of the disc 22 create an air space 42 which promotes the dissipation of heat from the heat sink 35. The feet 28 hold the skirt 26 away from the circuit board 40 and provide a stable support for the heat sink assembly prior to and during a soldering operation. The channels 30 created by the feet allow for the free flow of air around the fastener, particularly, around the tubular body 14 to insure a clean solderable connection between the body 14 and the board 40. The spacer 18 is made of a rigid high performance thermoplastic material which preferably has good resistance to creep, and low sensitivity to thermal changes.

It should be noted that the sleeve 32 is carried by the collar 24, and is preferably adhesively bonded thereto. However, a mere interference fit may be sufficient in less disturbing assembly environments.

The spacer 18 and the nut 12 are pre-assembled to one another at the perimeter of the flange 16. The sonically deformed portion 20 is at the outer edge of the flange 16 so that the flange 16 can flex and allow axial movement of the tubular body as the screw 38 is tightened and loosened. The deformed portion 20 of the spacer 18 is thin so it will be less rigid than the rest of the spacer 18. This allows the deformed portion 20 to undergo slight movement during the flexing of the flange 16.

By combining a nut 12, a springe flange 16, a spacer 18, and a sleeve 32 into a single component, significant labor at the time of final circuit construction can be saved. With a fastener of the present invention a proper clamping pressure between the transistors 34 and the heat sink 35 maintained, and proper electrical connection between the transistor base 37 and the circuit board 40 is assured.

It is evident that many modifications, substitutions and variations will be apparent to those skilled in the art. Accordingly, the invention is inteneded to embrace all such modifications, substitutions and variations as fall within the spirit and scope of the appended claims.

I claim:

1. An insulator for use in electrically isolating a plurality of heat generating components attached to a heat sink of predetermined thickness, said insulator comprising a generally flat spacer having means for attaching said spacer to an associated nut, a collar integrally formed with and extending from said spacer, a movable sleeve pre-assembled to and carried by said collar, said collar and said sleeve projecting generally perpendicularly from said spacer, said collar and said sleeve being generally concentrically disposed tubular elements having a predetermined longitudinal extent , said sleeve being a resilient collapsible rubber sleeve fitted over said collar , whereby, upon assembly of said components to said heat sink, said longitudinal extent is reducible to generally equal said thickness thereby fully insulating said components from said heat sink.

2. An insulator according to claim 1 wherein said means for attaching said spacer to a nut comprise an axially extending skirt and a portion of said skirt being sonically deformable.

3. An insulator according to claim 1 wherein said sleeve is adhesively attached to said collar.

4. An insulator according to claim 1 wherein said spacer includes a generally axially extending skirt with means disposed thereon for creating channels for flow of fluids beneath said spacer.

* * * * *